United States Patent [19]
Kato et al.

[11] Patent Number: 4,836,788
[45] Date of Patent: Jun. 6, 1989

[54] PRODUCTION OF SOLID-STATE IMAGE PICK-UP DEVICE WITH UNIFORM DISTRIBUTION OF DOPANTS

[75] Inventors: Yasaburo Kato; Toshihiko Suzuki; Nobuyuki Isawa; Hideo Kanbe; Masaharu Hamasaki, all of Tokyo, Japan

[73] Assignee: Sony Corporation, Tokyo, Japan

[21] Appl. No.: 927,161

[22] Filed: Nov. 5, 1986

[30] Foreign Application Priority Data

Nov. 12, 1985 [JP] Japan .................. 60-253269
Nov. 12, 1985 [JP] Japan .................. 60-253270
Nov. 12, 1985 [JP] Japan .................. 60-253271

[51] Int. Cl.[4] .................. H01L 21/265; H01L 31/18
[52] U.S. Cl. .................. 437/017; 156/617.1; 357/30; 437/916
[58] Field of Search .................. 437/17, 916; 156/617 SP, 620; 357/30

[56] References Cited

U.S. PATENT DOCUMENTS

| | | | |
|---|---|---|---|
| 4,027,051 | 5/1977 | Revschel et al. | 148/DIG. 165 |
| 4,547,957 | 10/1985 | Savoye et al. | 148/DIG. 24 |
| 4,619,730 | 10/1986 | Suzuki et al. | 156/617 SP |
| 4,639,276 | 1/1987 | Nakagawa | 148/1.5 |
| 4,659,423 | 4/1987 | Kim | 156/617 SP |

FOREIGN PATENT DOCUMENTS

29048  5/1971  Australia .

OTHER PUBLICATIONS

Haas et al., IEEE—Trans—Electron Devices, vol. Ed 23. (1976) 803.
Corisa et al., Jour. Appl. Phys. 50 (1979) 6838.

Primary Examiner—Upendra Roy
Attorney, Agent, or Firm—Ronald P. Kananen

[57] ABSTRACT

A method for fabricating a solid-state image pick-up device changes part of the constituent elemental Si into the n-type impurity phosphorus P, thus changing the substrate to an n-type, by atomic transmutation through neutron irradiation of a p-type silicon Si wafer, and thus produces a Si substrate with a resistivity $\rho_s$ of 10 to 100 ohm-cm. or preferably 40 to 60 ohm-cm. A solid-state image pick-up device with a plurality of photosensors and vertical and horizontal shift registers as set forth above is then fabricated using the resulting Si substrate. In the preferred process, the silicon substrate can be obtained by irradiating a wafer sectioned from a crystal grown by the MCZ method, for instance, with neutrons as described before until it has the required resistivity $\rho_s$. This silicon substrate is preferably of a p-type before neutron irradiation, that is, in the crystal growth state, and its resistivity $\rho_o$ is then ten or more times higher (100 ohm-cm. or more) than that $\rho_s$ obtained following neutron irradiation. For instance, if $\rho_s$ is to be 40 to 50 ohm-cm., $\rho_o$ should be 680 to 1180 ohm-cm. Then, n-type impurities, e.g. phosphorus P are generated by neutron irradiation to convert the silicon substrate to n-type with a low resistivity of $\rho_s$=10 to 100 ohm-cm., or of 40 to 50 ohm-cm.

26 Claims, 3 Drawing Sheets

PRODUCTION OF SOLID-STATE IMAGE PICK-UP DEVICE WITH UNIFORM DISTRIBUTION OF DOPANTS

BACKGROUND OF THE INVENTION

1. Field of the Invention

The present invention relates generally to a solid-state image pick-up device. More specifically, the invention relates to a solid-state image pick-up device comprising a charge-coupled device (CCD) of the so-called vertical overflow drain-type (V-OFD type) which drains excess electrical charge through its substrate. The invention also relates to a method for producing a solid-state image pick-up device comprising a V-OFD CCD.

2. Description of the Background Art

CCD-based solid-state image pick-up devices have recently been developed and used. In general, CCD-based solid-state image pick-up devices comprise a plurality of photosensor elements arranged in rows and columns on a semiconductor substrate. Each solid-state image pick-up device also has a plurality of vertical shift registers and a plurality of horizontal shift registers. The vertical shift registers having a CCD configuration are disposed to one side of each column of the photosensor elements and have transfer sections respectively corresponding to the adjacent photosensor elements for transferring electrical charges from the photosensor elements to the horizontal shift registers. The charge in the horizontal shift register is output through an output circuit as image data indicative of the intensity of received light along a single horizontal line.

In this type of solid-state image pick-up device, minority carriers generated at each photosensor element according to the intensity of the light received are transferred to the corresponding transfer section of the shift register corresponding to that vertical column. In each shift register, the minority carriers are transferred to the adjacent transfer section in sequence toward the horizontal shift register, so that pixel image signals according to the intensity of the received light at each photosensor elements are output through an output terminal of an output circuit of the horizontal shift register for each horizontal line in sequence, as described above.

When the photosensor element is exposed to light of excessive intensity, an excess of carriers are generated. The carriers are conducted without restraint from the photosensor elements to the shift register. This results in "blooming" on the picked-up image. In order to avoid the blooming effect, it would be possible to consider the technique of providing an overflow drain region in the vicinity of each photosensor element. In this case, however, high-density lay-out and miniaturization of the pixel elements would be made almost impossible by the area occupied by the drain regions. To resolve the aforementioned problems, a V-OFD type solid-state image pick-up device can be employed. V-OFD type solid-state image pick-up devices drain excess carriers into or through the substrate without the need for overflow drain regions in the circuit plane.

In the proposed V-OFD type solid-state image pick-up device, a potential barrier of a predetermined height is produced with respect to the carrier at a predetermined depth from the major plane of the substrate due to the presence of a well layer. The leakage of carriers into the substrate along the vertical axis can be thus limited or controlled. However, in cases where intense light is applied to the photosensor elements, thereby generating a great number of carriers, the excess carriers overflow down to the level of the barrier and then flow out through the substrate. This prevents the excess carriers from passing into the vertical shift register.

However, when such a V-OFD type solid-state image pick-up device is made from an n-type silicon monocrystal substrate obtained from an n-type silicon monocrystal body grown by the Czochralski technique (hereafter referred to as "the CZ method"), a fixed, striped pattern of noise tends to be produced. Furthermore, white dots tend to appear due to faults formed by crystal dislocations and so forth.

The fixed, striped noise pattern is due to non-uniform distribution of n-type dopant impurities, such as phosphorus, necessary for growing n-type silicon monocrystal bodies. This non-uniformity of concentration can be as much as 5%. The pitch of this concentration of non-uniformity can be as long as 60 to 400 $\mu$m. This striped concentration non-uniformity is called "striation", and is caused by fluctuations in the environment or conditions surrounding the solid-liquid interface as the crystal is grown. The main factors are believed to be changes in the amount of boron (B) and oxygen (O) drawn from the inner periphery of the quartz crucible accommodating the liquid melt, due to fluctuations in crystal growth rate or to convection within the silicon melt due to temperature variations or segregation of n-type dopant from the melt during crystal growth or solidification.

The oxygen in the Si substrate is activated as a donor after heat treatment at 450° C. or higher, whereupon it has the effect of suppressing increases in the number of dislocations due to heat treatment of the Si substrate; that is, it acts as a "getter" of dislocation nuclei.

In addition, recently, a method in which crystal growth is performed in a magnetic field has been proposed in conjunction with the development of crystal growth techniques disclosed in the Japanese Patent Second (examined) Publication (Tokko) Showa No. 58-50951. The modified CZ method disclosed in the above-identified Japanese Patent Second Publication will be hereafter referred to as the "MCZ method". According to the MCZ method, convection is suppressed, enabling crystal growth under stable conditions, and additionally the amount of oxygen (O) or boron (B) drawn from the crucible can stably and easily be controlled.

However, even in this MCZ method, the amount of n-type dopant in the melt appearing in the actually-grown crystal is difficult to hold to a fixed concentration due to the effect of segregation. In addition, the concentration of n-type impurity dopant in the melt may change between the start of the crystal growth and the end of the crystal growth, so that there is a gradient in concentration of n-type impurities between the top of the crystal corresponding to the start of growth and the bottom of the crystal corresponding to the end of the growth.

SUMMARY OF THE INVENTION

Therefore, it is a principle object of the present invention to provide a solid-state image pick-up device which can reliably prevent non-uniform distribution of n-type impurities and the resulting faults described above.

Another object of the invention is to obtain an n-type Si substrate suitable for use in a solid-state image pick-up device, which substrate has a desired high resistivity, and which will not induce fixed-pattern noise, low picture quality or an otherwise defective product due to the presence of crystal defects.

In order to accomplish the above-mentioned and other objects, a method for fabricating a solid-state image pick-up device, according to the present invention, changes part of the constituent elemental Si into the n-type impurity phosphorus (P), thus changing the substrate to an n-type, by atomic transmutation by neutron irradiation of a p-type silicon Si wafer, and thus produces a Si substrate with a resistivity $\rho_s$ of 10 to 100 ohm-cm. or preferably 40 to 60 ohm-cm. A solid-state image pick-up device with a plurality of photosensors and vertical and horizontal shift registers as set forth above is then fabricated using the resulting Si substrate.

In the preferred process, the silicon substrate can be obtained by irradiating a wafer sectioned from a crystal grown by the MCZ method, for instance, with neutrons as described above until the substrate has the required resistivity $\rho_s$. This silicon substrate is preferably of a p-type before neutron irradiation, that is, in the crystal growth state, and its resistivity $\rho_o$ is then ten or more times higher (100 ohm-cm. or more) than that resistivity $\rho_s$ obtained following neutron irradiation. For instance, if the required resistivity $\rho_s$ is to be 40 to 50 ohm-cm, original resistivity $\rho_o$ should be 680 to 1180 ohm-cm. Then, n-type impurities, e.g. phosphorus (P), are generated by neutron irradiation to convert the silicon substrate to an n-type with a low resistivity of $\rho_s = 10$ to 100 ohm-cm, or of 40 to 50 ohm-cm.

In addition, as described above, when fabricating a high-resistivity (100 ohm-cm. or more) Si crystal, it is possible to use an undoped Si melt in the MCZ method. This undoped Si melt would make it possible to obtain a p-type high-resistivity crystal because p-type impurities, in particular soluble boron (B), from the quartz crucible will mix therewith.

The oxygen concentration in this Si crystal, that is, in the Si substrate is $2 \times 10^{17}$ to $1.2 \times 10^{18}$ atoms/cm$^3$. This oxygen concentration can be determined by selecting the amount of oxygen to be drawn from the quartz crucible according to the intensity of the applied magnetic field, the rotational speed of the crucible, the rotational speed of the crystal-pulling mechanism, and so forth during crystal growth by the MCZ method.

Solid-state image pick-up elements are formed on this silicon substrate by introducing p-type impurities into the major plane by ion implantation or difusion to form a p-type well layer; a p-type channel stopper region; a similar p-type well region where necessary; and n-type region photosensors in the p-type well layer, by ion implantation or diffusion so as to form the photosensor section and the vertical and horizontal shift registers.

As already described, in the present invention, since an n-type silicon substrate with a predetermined resistivity $\rho_s$ can be formed by irradiation with neutrons, the initial resistivity $\rho_o$ can be high, so that it is possible to prevent n-type dopant impurities from mixing with the melt during the crystal growth process. Thus, it is possible to avert non-uniform dopant concentration due to segregation of impurities as described before. In addition, since n-type phosphorus (P) atoms are generated by neutron irradiation of the Si substrate, it is possible to reliably obtain an n-type substrate of any desired concentration to a high accuracy by selecting the amount of uniform neutron irradiation. Therefore, the solid-state image pick-up device according to the present invention thus formed will reliably exhibit the barrier effect as designed without non-uniform dopant distribution, so that fixed, striped noise patterns will not appear.

Furthermore, since the resistivity $\rho_s$ of the silicon substrate is designed to be 10 to 100 ohm-cm., it is possible to make a solid-state image pick-up device with high picture quality and without bloom or defects such as white dots. In more detail, if $\rho_s$ were less than 10 ohm-cm., the concentration of then n-type impurities in the silicon substrate itself would be excessively high, so that the potential barrier related to the overflow would be too near the surface 1a of the silicon substrate and therefore it would be impossible for the photosensor section to accumulate a sufficient signal charge. On the other hand, if $\rho_s$ were to exceed 100 ohm-cm., the oxygen in the silicon substrate would be activated by heat treatment during manufacture of the solid-state image pick-up device, so that the characteristics of the device would be affected by the change to a donor state.

In the present invention, the oxygen concentration in the silicon substrate is designed to be a relatively high value, as high as $2 \times 10^{17}$ to $1.2 \times 10^{18}$ atoms/cm$^3$. This makes it possible for the oxygen to have a gettering effect on crystal dislocation nuclei. As a result, it is possible to make a solid-state image pick-up device with good characteristics and without white dots.

In the present invention, in particular, a grown crystal body remains p-type and the p-type substrate is converted to an n-type by neutron irradiation. Therefore, since the extent of neutron irradiation can be controlled over a large range, the irradiation can be performed in a range within which the intensity can be controlled accurately. That is, it is possible to manufacture a device with stable and uniform characteristics by accurately setting the $\rho_s$ value.

According to one aspect of the invention, a method for producing a solid-state image pick-up device comprises the steps of:

growing from a non-doping silicon melt a p-type silicon monocrystal with substantially high resistance;

forming a silicon wafer from the silicon monocrystal and irradiating neutrons to the silicon wafer to form an n-type silicon substrate with a resistance smaller than that of the silicon monocrystal; and forming the solid-state image pick-up device with a plurality of the photosensor elements and shift registers on the substrate.

The non-doping silicon melt is contained in a quartz crucible which is heated by means of a heating means, and the silicon monocrystal is drawn from the non-doping silicon melt. The crucible contains boron which melts into the non-doping silicon melt during the silicon monocrystal growing process to form the p-type silicon monocrystal. The step of growing the p-type silicon monocrystal including control of the melting rate of the boron into the silicon melt and oxygen concentration in the silicon melt.

In preferred process, the control of the melting rate of the boron and oxygen is controlled by forming a controlled intensity magnetic field around the crucible. The melting rate of the boron and concentration of oxygen in the silicon melt is further controlled by controlling the rotation speed of the crucible.

In practice, the p-type silicon wafer has a resistance rate higher than 100 ohm-cm. The resistance rate of the silicon substrate is in a range of 10 ohm-cm. to 100 ohm-cm. Further preferably, the resistance rate of the p-type silicon monocrystal is preferably in a range of 680 ohm-cm. to 1180 ohm-cm. and the resistance rate of the silicon substrate is in a range of 40 ohm-cm. to 50 ohm-cm.

The step of irradiating neutrons forms a uniform distribution of phosphorus in the silicon substrate.

According to another aspect of the invention, a method for producing a silicon substrate comprises the steps of:

providing a non-doping silicon melt in a rotatable crucible made of quartz;

forming a magnetic field around the crucible;

controlling rotation speed of the crucible at a predetermined speed;

drawing a silicon melt to cause solidification for forming a p-type silicon monocrystal;

forming a silicon wafer from the silicon monocrystal; and irradiating neutrons onto the silicon wafer to obtain an n-type silicon substrate.

The rotation speed of the crucible is so controlled as to control the resistance rate of the silicon monocrystal to greater than 100 ohm-cm. and to control the concentration of oxygen in a range of $2 \times 10^{17}$ to $2 \times 10^{18}$ atoms/cm$^3$.

According to a further aspect of the invention, a solid-state image pick-up device comprises an n-type silicon substrate formed from a silicon monocrystal by irradiating neutrons, a plurality of photosensor elements formed on the substrate, a charge transfer means for transferring electric charge generated in each of the photosensor elements, and a draining means for draining excessive carriers generated in response to excessive light irradiated on the photosensor elements.

BRIEF DESCRIPTION OF THE DRAWINGS

The present invention will be understood more fully from the detailed description given herebelow and from the accompanying drawings of the preferred embodiment of the invention, which, however, should not be taken to limit the invention to the specific embodiment but are for explanation and understanding only.

In the drawings.

DESCRIPTION OF THE PREFERRED EMBODIMENT

Figure 1:
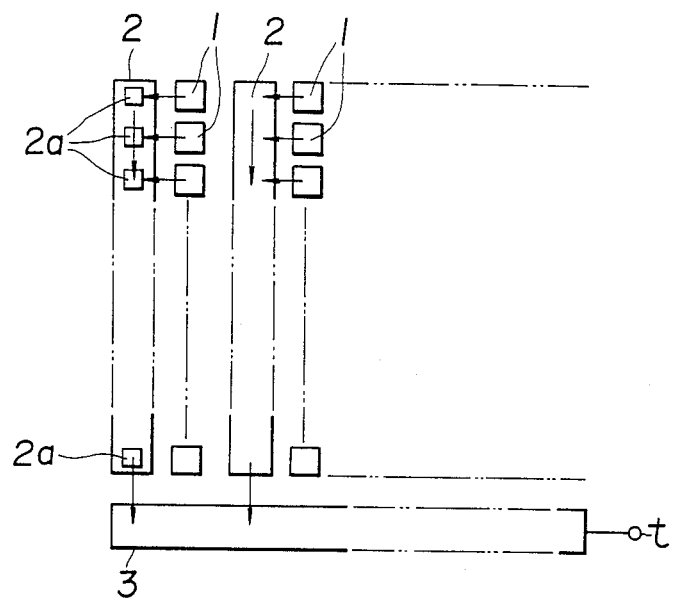
FIG. 1 is a diagram of an example of a solid-state image pick-up device according to the present invention.
Figure 2:
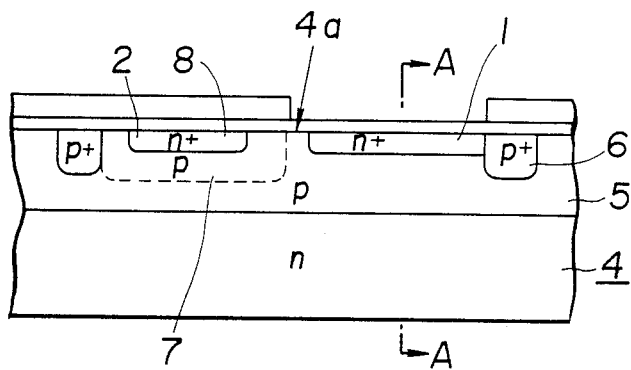
FIG. 2 is an enlarged diagrammatical cross-sectional view through an essential section thereof.

Referring now to the drawings, FIGS. 1 and 2 illustrate the structure of a typical CCD-based solid-state image pick-up device or solid-state imaging device. FIG. 1 is a diagram of the lay-out of the circuitry of the image pick-up device. In this drawing, the solid-state image pick-up device is made up of a plurality of photosensor sections 1 arranged in rows and columns. Each of the photosensor sections 1 constitutes one picture element on a common silicon substrate. Vertical shift registers 2 of CCD configuration are disposed to one side of each column of photosensor sections 1. A common horizontal shift register 3 of CCD configuration is disposed at one end of all of the shift registers 2. Each vertical shift register 2 has transfer sections 2a, one corresponding to each adjacent photosensor 1. Minority carriers generated at each photosensor 1 according to the amount of light sensed are transferred to the corresponding transfer sections 2a of the corresponding shift registers 2 for each vertical column. In each shift register 2, the minority carriers are transferred to the adjacent transfer section 2a in sequence toward the horizontal shift register 3. Therefore, picture element signals according to the amount of light sensed at each photosensor section 1 are outputted from an output terminal t of an output circuit of the horizontal shift register 3 for each horizontal line in sequence.

In the solid-state image pick-up device described above, when the photosensor section 1 is irradiated by strong light and thereby an excess of carriers is generated, the carriers are conducted without constraint from the photosensor section 1 to the shift register 2, thus resulting in blooming. To avert this blooming effect, an overflow drain region is provided in the vicinity of each photosensor section 1 to prevent an excess of carriers. The overflow drain regions is formed as shown in the diagrammatical cross-section through an essential portion of the solid-state image pick-up device. In FIG. 2, a p-type well layer 5 is formed on the major plane 4a of an n-type silicon substrate 4 by ion-implantation or diffusion techniques. The n-type region photosensor section 1 is selectively formed on the well facing the major plane 4a by ion-implanatation or diffusion techniques. The reference numeral 6 denotes a channel stopper region in the major plane 4a, which divides the shift registers 2 and 3 and the photosensors 1. Where necessary, a p-type well region 7 can be selectively formed in the shift register 2, and an n-type region constituting the transfer section 8 of the shift register 2 can be formed on the region 7 facing the major plane 4a.

Figure 3:
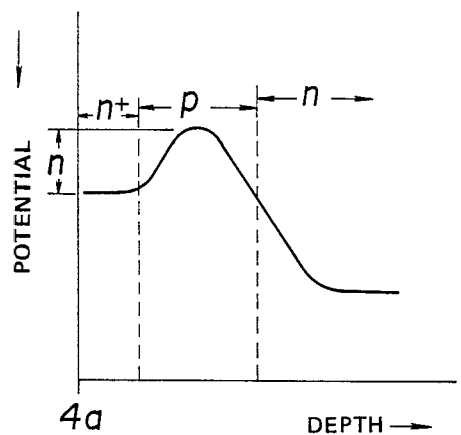
FIG. 3 is a potential diagram taken along the line A—A of FIG. 2.
Figure 5:
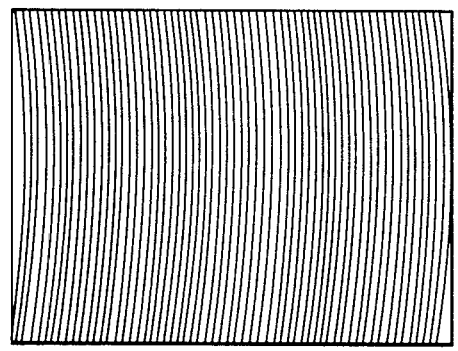
FIG. 5 is an image of the striped noise pattern occurring in prior-art solid-state image pick-up devices.

The potential distribution of the carriers through the thickness of the photosensor section 1 is shown in FIG. 3. Since a potential barrier of predetermined height h is produced with respect to the carrier at a predetermined depth from the major plane 4a due to the presence of the p-type well layer 5, the leakage of the carriers into the substrate along the vertical axis can be limited. However, in cases where intense light is applied to the photosensor section 1, thus generating a great number of carriers, since the barrier height h is appropriately limited, carriers in excess of this level will be discharged over this barrier into the substrate, so that excess carriers are prevented from passing into the shift register 2.

In production of the solid-state image pick-up device based on V-OFD type CCD as set forth above, a p-type silicon monocrystal was grown by the MCZ technique. In the process of growth of the p-type silicon monocrystal by MCZ method, oxygen concentration in the silicon monocrystal is controlled by controlling the magnetic field generated around the crucible holding the silicon melt.

Figure 4:
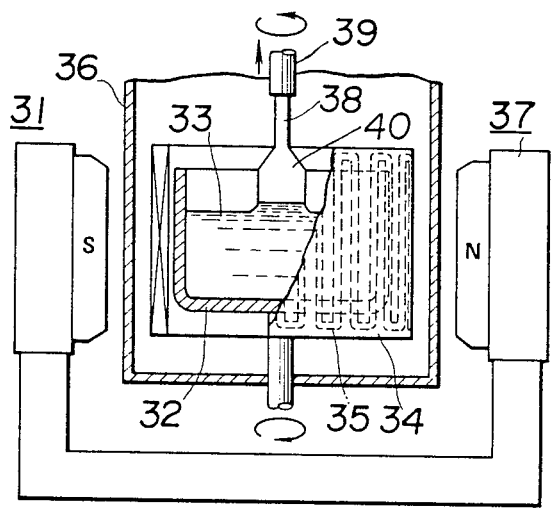
FIG. 4 is a cross-section through a silicon monocrystal growing apparatus for performing the MCZ method.

An apparatus for implementing the MCZ method is shown in FIG. 4. In FIG. 4, a silicon crystal growing apparatus 31 has a quartz crucible retaining molten silicon 33 from which a crystal 40 is grown. This crucible 32 is rotated about its central axis at an adjustable rotational speed. A heating means 34 surrounds this crucible 32. This heating means 34 may be a cylindrical electric heater 35. Outside this heating means is a cylindrical heat insulating body, or a jacket 36 cooled by water, as necessary. Outside this is a direct-current magnetic field generating means 37 made up of a permanent magnet or an electromagnet. The numeral 38 denotes a silicon monocrystal seed; 39 denotes a drawing chuck. This drawing chuck raises the silicon monocrystal seed 38 while rotating it about the rotational axis of the crucible.

The electrical power supply to the heating means 34 is dc current with 4% or less ripple or a 1 kHz or higher alternating or pulsating current. This type of current has been proven adequate to prevent unnecessary resonance between the heating means 34 and the magnetic field.

The monocrystalline silicon seed 38 is drawn away from the molten silicon surface at a predetermined speed so as to induce growth of a silicon monocrystal 40. In this case, varying the rotational speed of the crucible 32 in particular also changes the oxygen concentration in the finished crystal 40. This is due to the following reason: the molten silicon in the crucible has an effective viscosity enhanced by application of a magnetic field and it is rotating relative to the crucible rotation, resulting in frictional contact between the molten silicon 33 and the inner walls of the crucible 32. As a result, oxygen in the walls of the crucible 32, specifically of the quartz, is dissolved in the molten silicon 33. The oxygen concentration in the growing crystal 40 increases because the dissolution of oxygen increases with increasing frictional contact, that is, with increasing rotational speed of the crucible relative to the molten silicon 33. It has also been confirmed that a higher oxygen concentration in the crystal can be achieved when a magnetic field is applied than when no magnetic field is applied, assuming the rotational speed of the crucible is sufficiently high.

As described above, it is preferable to have a high oxygen concentration in the silicon monocystal used as the silicon substrate to obtain a more pronounced getter effect. This is made possible by growing the silicon monocrystal at a rate higher than is commonly used in the conventional CZ method. For instance, the silicon monocrystal growth speed is preferably higher than or equal to 1.2 mm/min., more preferably 1.5 mm/min to 2.1 mm/min.

As is well known, in the CZ method, the maximum monocrystal growth rate $V_{max}$ can be expressed as follows, assuming that the solid-liquid interface between the monocrystal and the silicon melt is flat and there exists no radial temperature gradient in the monocrystal:

$$V_{max} = \frac{k}{h\rho}\left(\frac{dT}{dX}\right)$$

where k denotes the thermal conductivity of the monocrystal, h denotes the heat of solidification, denotes density, and dT/dX denotes the temperature gradient in the solid phase (monocrystal) at the solid-liquid interface. Specifically, X denotes distance along the longitudinal axis of the monocrystal. In the above expression, since k, h, and $\rho$ are inherent properties of the material, it would be necessary to increase the temperature gradient dT/dX in order to obtain a large growth rate $V_{max}$. In the above-mentioned CZ method, however, since the monocrystal is heated by radiation from the surface of silicon melt, the inner walls of the crucible and the heat generator, the above value of temperature gradient (dT/dX) is inevitably limited, so that the growth rate has always been relatively small in practice.

As will be appreciated from the above discussion, the growth rate of the silicon monocrystal can be accelerated by reducing the heat applied to the molten silicon by the heat generator and thus lowering the temperature of the molten silicon. Although this has a direct proportional effect toward lowering the thermal gradient, by the Stefan-Boltzmann law, the heat radiated toward the monocrystal is reduced to a much greater extent, so that the net effect is an increase in dT/dX. However, reducing the heat generated by the heat generator in order to obtain a higher growth rate means that the surface of the molten silicon will tend to solidify since the surface of the molten silicon is cooled by exposure to the gaseous furnace atmosphere. This limits how far the temperature of the molten silicon can be lowered.

The heat generator of the preferred silicon monocrystal growing apparatus is designed to apply enough heat to the surface of the molten silicon to maintain the silicon in the liquid state. In particular, the heat generator of the preferred construction is designed to apply more heat to the surface of the molten silicon than to the remaining body of the silicon so as to allow the temperature of the molten silicon to be minimized.

In the present invention, the silicon crystal is grown from an undoped silicon melt. This silicon melt was put into a quartz crucible; a DC magnetic field was applied in a direction perpendicular to that in which the crystal was pulled; and a monocrystalline body was grown by rotating the crucible or the seed crystal support, and/or the monocrystal pulling mechanism. During growth, the viscosity of the melt was controlled by the application of the magnetic field, that is, convection was controlled. In addition, by controlling the magnetic field intensity, and the revolution speed of the monocrystal pulling mechanism or the crucible, the amount of oxygen and boron drawn from or diffusing out of the quartz crucible was controlled so as to fix the oxygen concentration of the finished crystal and the resistivity $\rho_o$ of the p-type silicon.

In this way, a p-type silicon crystal with an oxygen concentration of $2 \times 10^{17}$ to $1.2 \times 10^{18}$ and a resistivity of 680 to 1180 ohm-cm. was obtained. This crystal was wafered and then irradiated with neutrons with the aid of a heavy-water furnace and a light-water furnace. As a result, the substrate 4 was converted from a p-type substrate to an n-type substrate with a resistivity $\rho_s$ of 40 to 50 ohm-cm.

Finally a V-OFD type solid-state image pick-up device was constructed by forming the photosensor section 1 and the shift registers 2 and 3 on the substrate 4 obtained as described above.

In the above embodiment, a monocrystal body was grown by the MCZ method. In this case, there exist various advantages; for example, the oxygen concentration can be determined accurately. However, it is also possible to grow a monocrystal by other methods.

As described above, in the present invention, since a p-type silicon substrate is converted to an n-type substrate by generating n-type, phosphorus (P) impurities in the p-type silicon substrate by neutron irradiation, it is possible to prevent non-uniform dopant concentrations otherwise caused when n-type impurities are added prior to crystal growth, to increase the intensity of neutron irradiation, to securely control the operation, to provide uniform characteristics, to reliably avert the generation of fixed noise patterns or white dots due to crystal faults, and to suppress generation of dislocations, this last because the gettering effect due to the oxygen concentration can be controlled by specifying the resistivity $p_s$ of the substrate. Therefore, the great practical advantages of a high-quality solid-state image pick-up device can be achieved.

While the present invention has been disclosed in terms of the preferred embodiment in order to facilitate better understanding of the invention, it should be appreciated that the invention can be embodied in various ways without departing from the principle of the invention. Therefore, the invention should be understood to include all possible embodiments and modifications to the shown embodiments which can be embodied without departing from the principle of the invention set out in the appended claims.

What is claimed is:

1. A method for producing a solid-state image pick-up device comprising the steps of:
   growing from a non-doping silicon melt a p-type silicon monocrystal with a substantially high resistance;
   forming a silicon wafer from said silicon monocrystal and irradiating neutrons to said silicon wafer to form an n-type silicon substrate with a resistance smaller than that of said silicon monocrystal; and
   forming said solid-state image pick-up device with a plurality of photosensor elements and shift registers on said substrate.

2. A method as set forth in claim 1, wherein said non-doping silicon melt is contained in a quartz crucible which is heated by means of a heating means, and said silicon monocrystal is drawn from said non-doping silicon melt.

3. A method as set forth in claim 1, wherein said p-type silicon wafer has a resistance rate higher than 100 ohm-cm.

4. A method as set forth in claim 1, wherein said step of irradiating neutrons forms uniform distribution of phosphorus in said silicon substrate.

5. A method as set forth in claim 2, wherein said crucible contains boron which melts into said non-doping silicon melt during said silicon monocrystal growing process to form said p-type silicon monocrystal.

6. A method as set forth in claim 5, wherein said step of growing said p-type silicon monocrystal includes the step of controlling the diffusion rate of boron and oxygen in said silicon melt.

7. A method as set forth in claim 3, wherein the resistance rate of said silicon substrate is in a range of 10 ohm-cm. to 100 ohm-cm.

8. A method as set forth in claim 6, wherein the step of controlling the diffusion rate of said boron and oxygen is performed by controlling the intensity of a magnetic field around said crucible.

9. A method as set forth in claim 8, wherein diffusion rate of said boron and concentration of oxygen in said silicon melt is further controlled by controlling rotation speed of said crucible.

10. A method as set forth in claim 7, wherein said resistance rate of said p-type silicon monocrystal is preferably in a range of 680 ohm-cm. to 1180 ohm-cm. and the resistance rate of said silicon substrate is in a range of 40 ohm-cm. to 50 ohm-cm.

11. A method for producing a silicon substrate comprising the steps of:
   providing a non-doping silicon melt in a rotatable crucible made of quartz;
   forming a magnetic field around said crucible;
   controlling rotation speed of said crucible at a predetermined speed;
   drawing said silicon melt to cause solidification for forming a p-type silicon monocrystal;
   forming a silicon wafer from said silicon monocrystal; and
   irradiating neutrons onto said silicon wafer to obtain an n-type silicon substrate.

12. A method as set forth in claim 11, wherein the rotation speed of said crucible is so controlled as to control the resistance rate of said silicon monocrystal to greater than 100 ohm-cm.

13. A method as set forth in claim 11, wherein, in said silicon monocrystal growing step, boron contained in said quartz crucible melts into said silicon melt to serve as p-type impurity.

14. A method as set forth in claim 11, wherein in said neutron irradiating step, phosphorus is formed in said silicon wafer to form n-type silicon substrate.

15. A method as set forth in claim 12, wherein the rotation speed of said cricible is so controlled as to control concentration of oxygen in a range of $2 \times 10^{17}$ to $2 \times 10^{18}$ atoms/cm$^3$.

16. A method as set forth in claim 13, wherein the rotation speed of said crucible is controlled to control amount of boron melting into said silicon melt.

17. A method as set forth in claim 15, wherein said n-type silicon substrate obtained by irradiating neutrons onto said silicon wafer has a resistance rate of 10 ohm-cm. to 100 ohm-cm.

18. A method as set forth in claim 16, wherein the rotation speed of said crucible is controlled to control an amount of boron melting into said silicon melt so that the silicon monocrystal has a resistance rate greater than 100 ohm-cm.

19. A method as set forth in claim 18, wherein the resistance rate of said silicon monocrystal is preferably in a range of 680 ohm-cm. to 1180 ohm-cm.

20. A method as set forth in claim 18, wherein said silicon substrate obtained by irradiating neutron onto said silicon wafer has resistance rate in a range of 10 ohm-cm. to 100 ohm-cm.

21. A method as set forth in claim 19, wherein said silicon substrate obtained by irradiating neutron onto said silicon wafer has resistance rate in a range of 40 ohm-cm. to 50 ohm-cm.

22. A method for producing a solid-state image pick-up device comprising the steps of:
   forming a p-type silicon wafer from a p-type and substantially non-doped silicon monocrystal;
   irradiating neutrons to said silicon wafer to form an n-type silicon substrate with a resistance smaller than that of said silicon monocrystal; and
   forming said solid-state image pick-up device with a plurality of photosensor elements and shift registers on said substrate.

23. A method for producing a solid-state image pick-up device comprising the steps of:
   forming a silicon wafer from a silicon monocrystal containing oxygen in a range of $2 \times 10^{17}$ to $2 \times 10^{18}$ atoms/cm$^3$;
   irradiating neutrons to said silicon wafer to form an n-type silicon substrate with a resistance smaller than that of said silicon monocrystal; and forming said solid-state image pick-up device with a plurality of photosensor elements and shift registers on said substrate.

24. A method for producing a silicon substrate comprising the steps of:

providing a non-doping silicon melt in a rotatable crucible made of quartz;

forming a magnetic field around said crucible;

controlling rotation speed of said crucible at a predetermined speed so that the oxygen concentration to be contained in said silicon melt is in a range of $2 \times 10^{17}$ to $2 \times 10^{18}$ atoms/cm$^3$;

drawing said silicon melt to cause solidification for forming as a p-type silicon monocrystal;

forming a silicon wafer from said silicon monocrystal; and irradiating neutrons to said silicon wafer to obtain an n-type silicon substrate.

25. A method for producing a solid-state image pick-up device comprising the steps of:

growing from a non-doping silicon melt a p-type silicon monocrystal with a resistance approximately 10 times higher than a desired resistance of silicon substrate on which photosensor elements are to be formed;

forming a silicon wafer from said silicon monocrystal and irradiating said silicon wafer with neutrons to form an n-type silicon substrate with said desired resistance; and forming said solid-state image pick-up device with a plurality of photosensor elements and shift registers on said substrate.

26. A method for producing a solid-state image pick-up device comprising the steps of:

growing from a non-doping silicon melt a p-type silicon monocrystal with a resistance in a range of 600 to 1100 ohm-centimeters;

forming a silicon wafer from said silicon monocrystal and irradiating said silicon wafer with neutrons to form an n-type silicon substrate with said desired resistance in a range of 10 to 100 ohm-centimeters; and forming said solid-state image pick-up device with a plurality of photosensor elements and shift registers on said substrate.

* * * * *